(12) United States Patent
Okano

(10) Patent No.: US 7,951,512 B2
(45) Date of Patent: May 31, 2011

(54) RETICLE FOR PROJECTION EXPOSURE APPARATUS AND EXPOSURE METHOD USING THE SAME

(75) Inventor: Daisuke Okano, Chiba (JP)

(73) Assignee: Seiko Instruments Inc., Chiba (JP)

( * ) Notice: Subject to any disclaimer, the term of this patent is extended or adjusted under 35 U.S.C. 154(b) by 309 days.

(21) Appl. No.: 12/399,541

(22) Filed: Mar. 6, 2009

(65) Prior Publication Data

US 2009/0225294 A1   Sep. 10, 2009

(30) Foreign Application Priority Data

Mar. 10, 2008 (JP) ................... 2008-058908

(51) Int. Cl.
*G03F 1/00* (2006.01)
*G03F 9/00* (2006.01)
*G03F 7/00* (2006.01)

(52) U.S. Cl. ................ 430/5; 430/22; 430/311

(58) Field of Classification Search ............. 430/5, 22, 430/30, 311, 312, 313, 394
See application file for complete search history.

(56) References Cited

U.S. PATENT DOCUMENTS
2010/0262943 A1 * 10/2010 Sogawa ................. 716/8

FOREIGN PATENT DOCUMENTS
JP          3-18012 A       1/1991
JP          2005-283609 A   10/2005

* cited by examiner

*Primary Examiner* — Stephen Rosasco
(74) *Attorney, Agent, or Firm* — Brinks Hofer Gilson & Lione

(57) ABSTRACT

In order to provide a reticle capable of increasing the number of chips per wafer and of enabling highly accurate alignment, and an exposure method using the reticle, a first alignment mark arrangement region (8) and a second alignment mark arrangement region (9) are provided on both sides of a multi-chip region (2) so that a sum of a size of the first alignment mark arrangement region and a size of the second alignment mark arrangement region is made the same as a size of a chip region (1).

16 Claims, 6 Drawing Sheets

RETICLE FOR PROJECTION EXPOSURE APPARATUS AND EXPOSURE METHOD USING THE SAME

RELATED APPLICATIONS

This application claims priority under 35 U.S.C. §119 to Japanese Patent Application No. JP2008-058908 filed on Mar. 10, 2008, the entire content of which is hereby incorporated by reference.

BACKGROUND OF THE INVENTION

1. Field of the Invention

The present invention relates to a reticle for a projection exposure apparatus and to an exposure method. More particularly, the present invention relates to an arrangement of alignment marks on a reticle and to an exposure method using the same.

2. Description of the Related Art

Use of a projection exposure apparatus is in a main stream manufacturing of a semiconductor device in recent years. A reticle substrate as a master for exposure is mounted on the projection exposure apparatus, and a pattern formed on the reticle substrate is transferred onto a wafer after reduction and projection. Generally, chips, alignment marks, and a process control module (PCM) for evaluating characteristics of essential elements such as a transistor and a diode are arranged on the reticle substrate.

Conventionally, the chips and the PCM are formed in different regions on the reticle substrate and the alignment marks are arranged in a chip region or a PCM region. When the alignment marks are arranged in the chip region, there arise a problem that a chip size becomes larger and the number of chips per wafer decreases. When the alignment marks are arranged in the PCM region, there arises a problem that an accuracy of the alignment is low because only one or several PCMs are formed on a wafer. In order to solve those problems, a method has been proposed in which the alignment marks are arranged in scribe lines (see Japanese Patent Application Laid-open JP 3-18012, for example).

However, in the method in which the alignment marks are arranged in scribe lines as described above newly presents a problem that metal shavings produced in dicing cannot be avoided. In order to solve the problem, a method has been proposed in which an alignment mark arrangement region is provided (see Japanese Patent Application Laid-open JP 2005-283609, for example).

However, in the method disclosed in Japanese Patent Application Laid-open JP 2005-283609, the alignment marks are arranged in a line only on one side of the reticle, and hence highly accurate alignment is difficult to attain. There is a problem that, among misalignment components including translational components, rotational components, and scaling components, components other than the translational components cannot be corrected satisfactorily, leading to a necessity for large alignment allowance, which impedes miniaturization of a semiconductor chip and decreases the number of chips per wafer.

SUMMARY OF THE INVENTION

The present invention has been made in view of the above-mentioned problems, and it is an object of the present invention to provide a reticle capable of increasing the number of chips per wafer, and an exposure method using the same.

In order to solve the above-mentioned problems, the present invention provides a reticle for a projection exposure apparatus, including on the same reticle substrate: rectangular chip regions each surrounded by sides in a first direction and sides in a second direction orthogonal to the first direction; a rectangular first alignment mark arrangement region surrounded by sides in the first direction and sides in the second direction; a rectangular second alignment mark arrangement region surrounded by sides in the first direction and sides in the second direction; a first scribe line region provided around the rectangular chip regions; and second scribe line regions provided so as to be adjacent to the sides in the second direction of the rectangular first alignment mark arrangement region and to the sides in the second direction of the rectangular second alignment mark arrangement region, respectively, in which: the rectangular first alignment mark arrangement region is adjacent to one end portion in the second direction of a multi-chip region including a plurality of the rectangular chip regions via the scribe line region; the rectangular second alignment mark arrangement region is adjacent to another end portion in the second direction thereof via the scribe line region; the rectangular first alignment mark arrangement region and the rectangular second alignment mark arrangement region each include at least an alignment mark arranged therein; and a sum of a length in the second direction of the rectangular first alignment mark arrangement region and a length in the second direction of the rectangular second alignment mark arrangement region is equal to or smaller than a length in the second direction of each of the rectangular chip regions.

The present invention further provides a reticle for a projection exposure apparatus, including on the same reticle substrate: rectangular chip regions each surrounded by sides in a first direction and sides in a second direction orthogonal to the first direction; a rectangular first alignment mark arrangement region surrounded by sides in the first direction and sides in the second direction; a rectangular second alignment mark arrangement region surrounded by sides in the first direction and sides in the second direction; and a scribe line region provided around the rectangular chip regions, the rectangular first alignment mark arrangement region, and the rectangular second alignment mark arrangement region, in which: the rectangular first alignment mark arrangement region is adjacent via the scribe line region to one end portion in the second direction of a multi-chip region including a plurality of the rectangular chip regions; the rectangular second alignment mark arrangement region is adjacent via the scribe line region to another end portion in the second direction of the multi-chip region; the rectangular first alignment mark arrangement region and the rectangular second alignment mark arrangement region each include at least an alignment mark arranged therein; and a sum of a length in the second direction of the rectangular first alignment mark arrangement region, a length in the second direction of the rectangular second alignment mark arrangement region, and a length (width) in the second direction of the scribe line region is equal to or smaller than a length of each of the sides in the rectangular second direction of each of the rectangular chip regions.

Further, when the above-mentioned reticle for a projection exposure apparatus is used to perform exposure to light, an exposure method according to the present invention simultaneously patterns on a wafer the chip region, the first alignment mark arrangement region, and the second alignment mark arrangement region.

According to the present invention, highly accurate alignment is made possible by arranging the alignment mark arrangement regions having the size of a half of the chip region or smaller on both sides of the multi-chip region in the reticle for a projection exposure apparatus, permitting miniaturization of the semiconductor chip. Further, the scribe lines have no alignment mark and no process control module (PCM) arranged therein, and hence the width of the scribe line region can be made small. Accordingly, the number of chips per wafer can be increased in an arrangement of small chips or long chips.

DETAILED DESCRIPTION OF THE PREFERRED EMBODIMENTS

With reference to the attached drawings, preferred embodiments of the present invention are described in the following.

Figure 1:
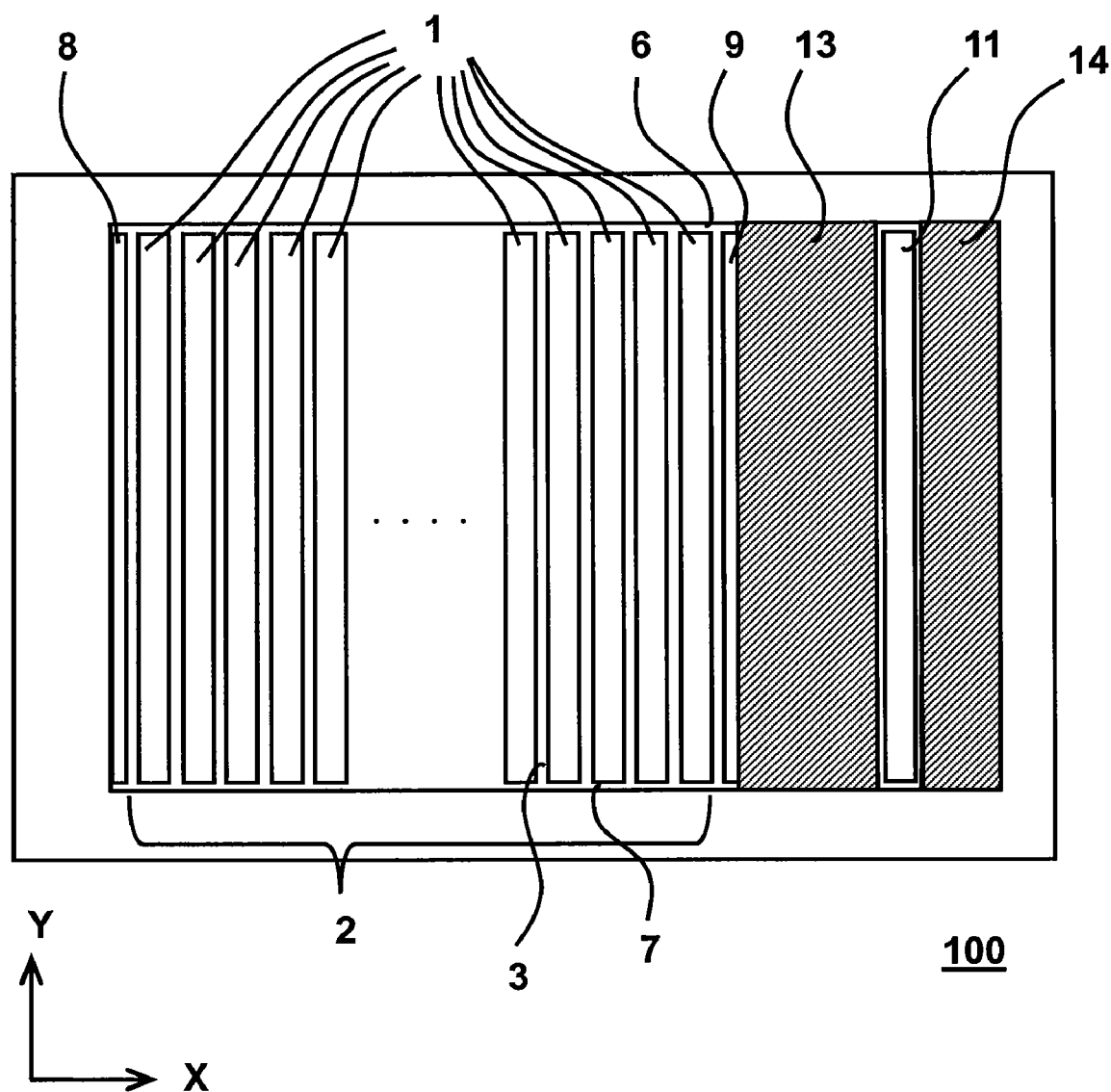
FIG. 1 is a plan view of a reticle for a projection exposure apparatus according to a first embodiment of the present invention.

FIG. 1 is a plan view of a reticle for a projection exposure apparatus according to a first embodiment of the present invention. A reticle substrate 100 is formed of a transparent low-expansion material such as synthetic quartz, and a pattern is formed on one surface thereof by using a light-shielding film of, for example, chromium oxide. Ordinarily, the surface of the reticle substrate 100 to which a chromium oxide film is attached is covered with a pellicle film, which is omitted in FIG. 1, for protection when used.

Ordinarily, in a projection exposure method, a size of the pattern on the reticle is different from a size of a pattern transferred onto a wafer. A magnification of ⅕ reduction is often used. The magnification means that, if the size of the pattern on the reticle is 100 μm, for example, the size of the pattern transferred onto the wafer is reduced to 20 μm. In the following description, all dimensions are dimensions of the pattern transferred onto the wafer.

N chip regions 1 each long in a first direction (Y direction) are formed on one surface of the reticle substrate 100 in a second direction (X direction) to form a multi-chip region 2. The chip region 1 is a rectangle surrounded by two sides in the first direction (Y direction) and two sides in the second direction (X direction), and a scribe line region 3 is arranged therearound. A width of the scribe line region 3 is generally 1 to 110 μm, and preferably 1 to 40 μm. In the embodiment illustrated in FIG. 1, the width of the scribe line region 3 is set to be 20 μm, and the scribe line region 3 has no alignment mark and no test element group pattern (hereinafter referred to as TEG pattern) arranged therein. The alignment marks and the TEG pattern are formed by laminating on a silicon substrate a relatively hard film such as a silicon oxide film or a silicon nitride film or an elastic material such as a metal film. When chips are separated from one another using a dicing saw by cutting along the scribe line region in which the alignment marks are formed, problems arise such as peeling of the laminated film which forms the alignment marks, occurrence of a crack in a chip, and life shortening of a blade of a dicer. However, according to the present invention, the alignment marks are not arranged in the scribe lines, and thus those problems can be solved.

Further, the scribe line region has no alignment mark arranged therein, and hence the scribe line region can be made narrower without being limited by the alignment mark. At present, a dicing saw is used when a wafer is divided into chips (in dicing) in most cases. Taking into consideration a cutting margin and a possible crack in a chip, the width of the scribe line region is necessary to be at least about 50 μm. However, if a method using a laser represented by stealth dicing is used, the width of the scribe line can be made extremely small, and even a width smaller than 50 μm is made possible. Accordingly, a ratio of the width of the scribe lines with respect to the width of the chips can be made smaller than that in a conventional case, a layout efficiency of the chips is improved, and the number of chips per wafer is increased.

A chip region 1 and an adjacent chip region 1 are arranged with the scribe line region 3 therebetween, and the adjacent chip region 1 and a chip region 1 adjacent to the adjacent chip region 1 are arranged with the scribe line region 3 therebetween. In this way, the reticle substrate 100 has the largest possible number of chip regions 1 arranged thereon. In a projection exposure method, one wafer is exposed to light a plurality of times. As the patterned region on the reticle substrate 100 increases, the number of times the wafer is exposed to light becomes smaller, and thus, the production efficiency increases correspondingly, whereby a largest possible number of chip regions 1 are sought to be arranged.

A first alignment mark arrangement region 8 is arranged at one end portion (left end portion) of the multi-chip region 2 formed by arranging the N chip regions 1 in the second direction (X direction) with the scribe line region 3 sandwiched between the first alignment mark arrangement region 8 and the multi-chip region 2. The first alignment mark arrangement region 8 is a rectangle surrounded by two sides in the first direction (Y direction) and two sides in the second direction (X direction). A length of the sides in the first direction of the first alignment mark arrangement region 8 is the same as that in the first direction of the chip region 1 while a length of the sides in the second direction is a half of that in the second direction of the chip region 1. Further, a second alignment mark arrangement region 9 is arranged at the other end portion (right end portion) of the multi-chip region 2 with the scribe line region 3 sandwiched therebetween. The second alignment mark arrangement region 9 is a rectangle surrounded by two sides in the first direction (Y direction) and two sides in the second direction (X direction). A length of the sides in the first direction of the second alignment mark arrangement region 9 is the same as that in the first direction of the chip region 1 while a length of the sides in the second direction is a half of that in the second direction of the chip region 1. In other words, the lengths in the first and second directions of the first alignment mark arrangement region 8 is the same as those of the second alignment mark arrangement region 9.

A top end scribe line region 6 is arranged at a top of the multi-chip region 2, the first alignment mark arrangement region 8, and the second alignment mark arrangement region 9, while a bottom end scribe line region 7 is arranged at a bottom of the multi-chip region 2, the first alignment mark arrangement region 8, and the second alignment mark arrangement region 9. A TEG pattern region 11 is arranged on a right side of the second alignment mark arrangement region 9. The TEG pattern region 11 is surrounded by the scribe line region 3 and is sandwiched between a first blade region 13 and a second blade region 14. A length of the TEG pattern region 11 in the second direction (X direction) is preferably equal to the length of the chip region 1 in the second direction (X direction). Although not shown in FIG. 1, a TEG pattern including a transistor, a diode, a resistor, and the like is arranged in the TEG pattern region 11. It is to be noted that a chromium oxide film is formed on the first blade region 13 and the second blade region 14 so that light for exposure does not pass therethrough.

Figure 2:
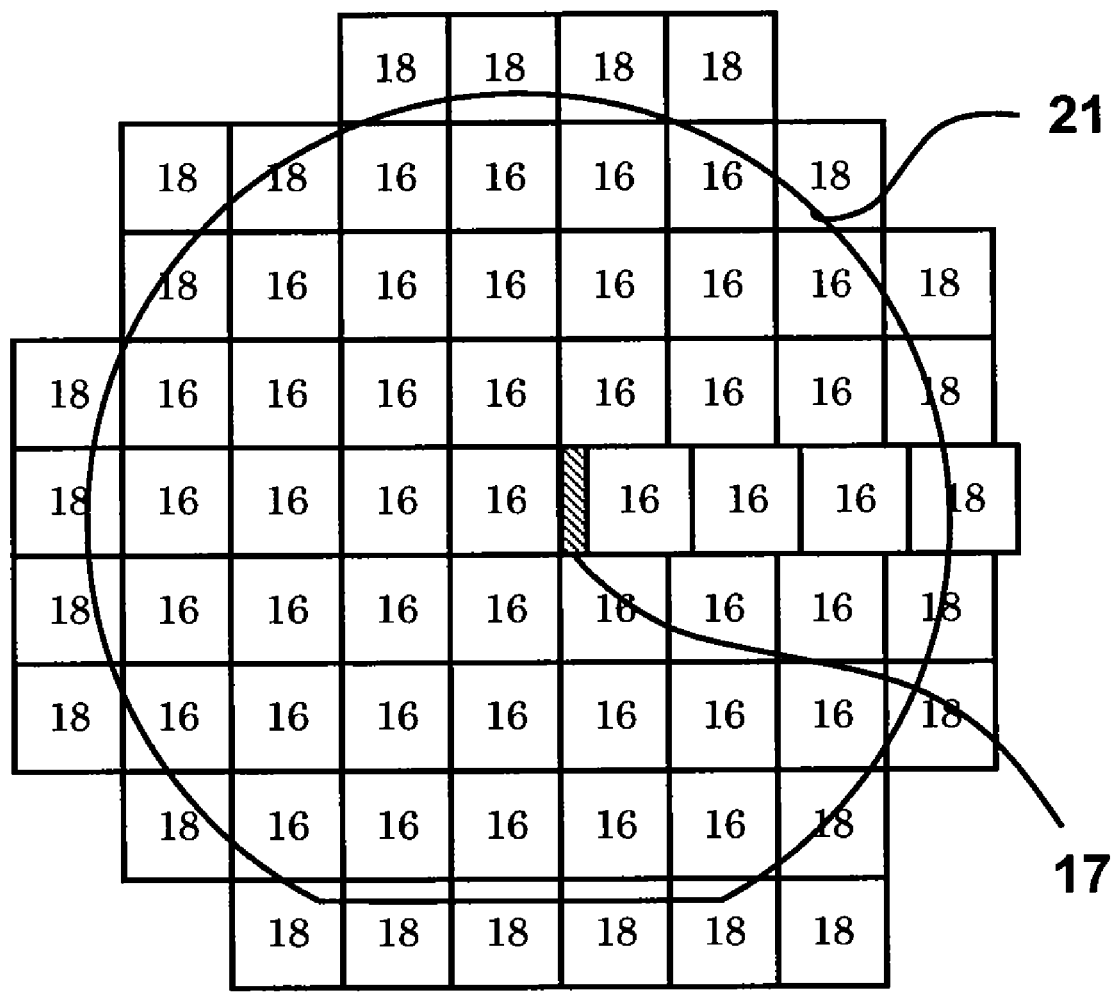
FIG. 2 illustrates a wafer which is patterned using the reticle.

Next, a method of patterning a wafer using the above-mentioned reticle substrate 100 is described with reference to FIG. 2. In a projection exposure method, a pattern on a reticle is reduced and transferred, and hence a pattern region of 100 mm×100 mm on the reticle is reduced to a pattern region of 20 mm×20 mm on the wafer. The wafer is thus exposed to light a plurality of times before the exposure is completed. A region which is patterned in one exposure is referred to as a shot. With regard to a 6-inch wafer, about 60 shots of exposure are carried out. In FIG. 2, shots A (16), a shot B (17), and shots C (18) are illustrated on a wafer 21.

In a shot A (16), the multi-chip region 2, the first alignment mark arrangement region 8, the second alignment mark arrangement region 9, and the scribe line region 3 are arranged, and there is no scribe line region 3 between shots A adjacent to each other. In other words, the first alignment mark arrangement region 8 in a shot is formed so as to be brought into direct contact with the second alignment mark arrangement region 9 in an adjacent shot. In order to attain such an arrangement as described above, exposure to light is carried out according to the following steps.

First, the reticle illustrated in FIG. 1 is set on a reticle mount of a projection exposure apparatus. Then, a predetermined stepper program is read, and a wafer transferred from a loader is set on a wafer chuck. The stepper program starts, and alignment (registration) is performed using the alignment marks on the reticle and alignment marks on the wafer. Here, both the alignment marks on the side of the reticle and the alignment marks on the side of the wafer are arranged on both sides of the shot, and hence misalignment components of the shot such as translational components, rotational components, and scaling components can be corrected and highly accurate alignment is made possible. If only the first alignment mark arrangement region is provided and the second alignment mark arrangement region is not provided, only translational components of the shot can be corrected, and accordingly cases in which highly accurate alignment is required cannot be accommodated.

According to the invention disclosed in Japanese Patent Application Laid-open JP 2005-283609, alignment marks in only one vertical line are arranged in the reticle. In such a case, rotational components and scaling components cannot be corrected, and hence the accuracy of alignment cannot be improved, requiring a large alignment allowance. Accordingly the semiconductor chip cannot be miniaturized and the number of chips per wafer decreases.

When the alignment is completed, only a region on the reticle to be patterned is surrounded by four blades at the top and bottom and on the right and left, respectively, and is irradiated with light to transfer onto the wafer the pattern of only a portion which is not covered with the blades. When an exposure is completed, the wafer is moved to the next shot position, and alignment and exposure are repeated. When exposure of the entire wafer is completed, the wafer is unloaded and is moved to a next step.

The above-mentioned description has been given for a case in which a die-by-die system is adopted, but there is also another system in which, after alignment with a plurality of shots within the wafer surface is performed, exposure and movement of the wafer are repeated. In the case of a layout illustrated in FIG. 2, first, the four blades are made to surround the region on the reticle so that the left blade is on the left of the first alignment mark arrangement region 8, the right blade is on the right of the second alignment mark arrangement region 9 (in the first blade region 13), the top blade is at the top of the top end scribe line region 6, and the bottom blade is at the bottom of the bottom end scribe line region 7, and the region is irradiated with light. When the wafer is moved between shots adjacent to each other side by side to be exposed to light, the wafer is moved so that a left end of the first alignment mark arrangement region 8 and a right end of the second alignment mark arrangement region 9 are brought into contact with each other. Further, when the wafer is moved between shots adjacent to each other vertically to be exposed to light, the wafer is moved so that the top end scribe line region 6 and the bottom end scribe line region 7 are overlaid on each other, and thus, a scribe line region with a width of 20 µm is formed between shots adjacent to each other vertically.

In the shot B (17) illustrated in FIG. 2, only the TEG pattern region is patterned. A region on the reticle is surrounded so that the left blade is in the first blade region 13, the right blade is in the second blade region 14, the top blade is at the top of the top end scribe line region 6, and the bottom blade is at the bottom of the bottom end scribe line region 7, and the region is irradiated with light. Here, the scribe line region is shared with adjacent shots. The shots C (18) are referred to as dummy shots having no chip and no TEG formed therein. It is to be noted that the order of forming the shots may be determined taking into consideration the processing time period and the like.

As described above, by making exposures using the reticle substrate 100 illustrated in FIG. 1, highly accurate alignment is made possible, which can miniaturize the semiconductor chip. Further, the scribe lines have no alignment mark and no process control module (PCM) arranged therein, and hence the width of the scribe line region can be made small. Accordingly the number of chips per wafer can be increased when small chips or long chips are arranged.

In the above-mentioned description, the embodiment has been described in which the length of the alignment mark arrangement regions in the second direction is exactly a half of the length of the chip region in the second direction, but the present invention is not limited thereto, and the length of the alignment mark arrangement regions in the second direction may be smaller than a half of the length of the chip region in the second direction. When such a configuration as described above is adopted, pitches of dividing the chips are not uniform, but the area occupied by the alignment mark arrangement regions on the wafer becomes smaller, and the number of chips per wafer is increased accordingly.

Figure 3:
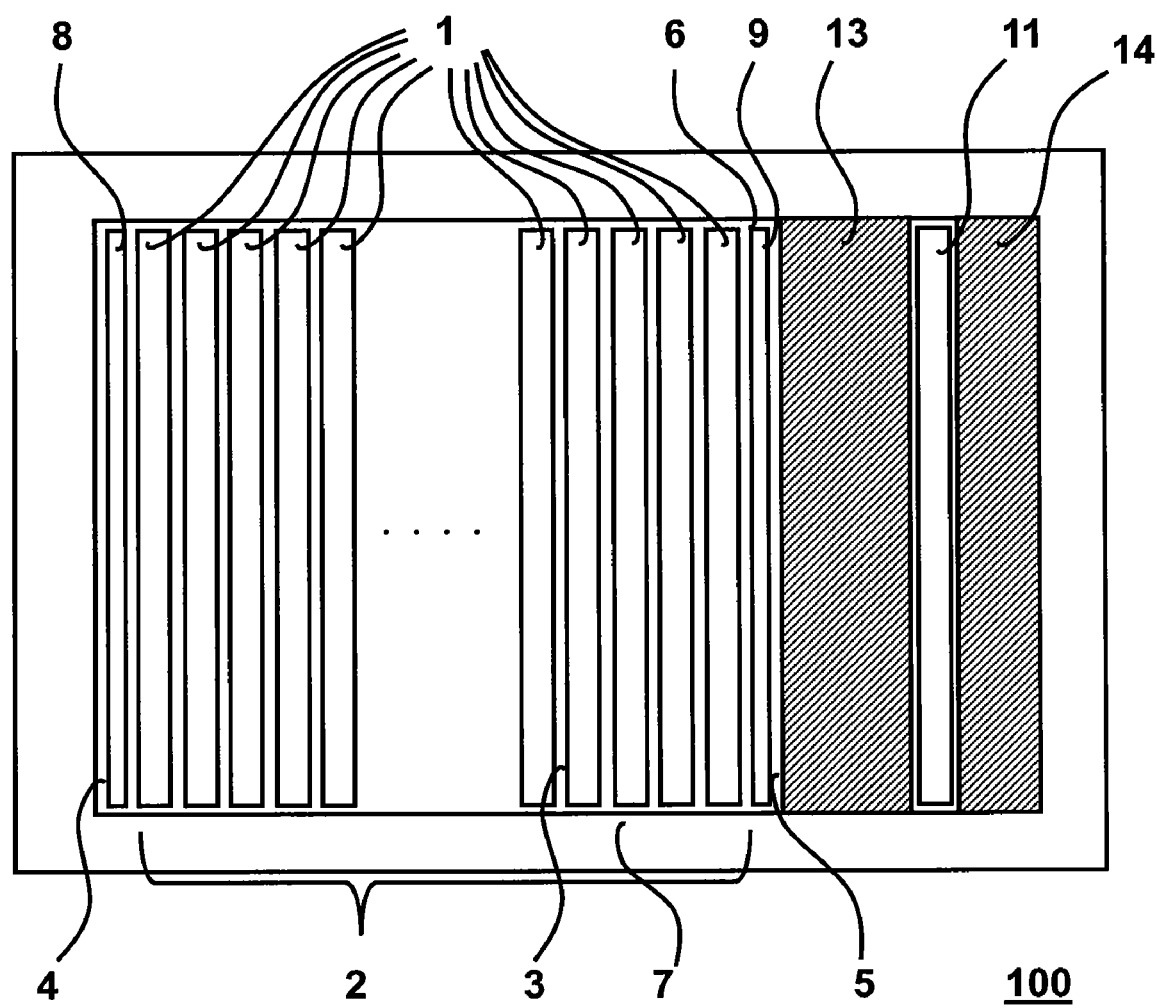
FIG. 3 is a plan view of a reticle for a projection exposure apparatus according to a second embodiment of the present invention.

FIG. 3 is a plan view of a reticle for a projection exposure apparatus according to a second embodiment of the present invention.

The reticle illustrated in FIG. 3 is different from that illustrated in FIG. 1 in that a left end scribe line region 4 is arranged on the left of the first alignment mark arrangement region 8 while a right end scribe line region 5 is arranged on the right of the second alignment mark arrangement region 9 so that the sum of the length of the first alignment mark arrangement region 8 in the second direction, the length of the second alignment mark arrangement region 9 in the second direction, and the length of the scribe line region in the second direction (width of the scribe line) is the same as the length of the chip region 1 in the second direction. It is to be noted that, the length of the first alignment mark arrangement region 8 in the second direction may be different from the length of the second alignment mark arrangement region 9 in the second direction, but are preferably the same, because both thereof have similar alignment marks 10 arranged therein. More specifically, when the length of the chip region in the second direction is 200 µm, for example, if the length of the scribe line region in the second direction is 20 µm, then both the length of the first alignment mark arrangement region in the second direction and the length of the second alignment mark arrangement region in the second direction are 90 µm.

In the second embodiment, a case in which the sum of the lengths of the two alignment mark arrangement regions in the second direction and the length of the scribe line region in the second direction are the same as the length of the chip region in the second direction has been described, but the present invention is not limited thereto, and the sum of the three lengths may be smaller than the length of the chip region in the second direction. When such a configuration as described above is adopted, the area occupied by the alignment mark arrangement regions on the wafer becomes smaller, and the number of chips per wafer is increased accordingly.

A method of patterning a wafer using a reticle substrate illustrated in FIG. 3 is similar to the method of patterning a wafer using the reticle substrate illustrated in FIG. 1, but differs to a certain extent in the method of arranging the shots A (16) adjacent to one another. While, in the reticle substrate illustrated in FIG. 1, the first alignment mark arrangement region 8 in a shot is arranged so as to be brought into direct contact with the second alignment mark arrangement region 9 in an adjacent shot, in the reticle substrate illustrated in FIG. 3, an exposure is made so that the first alignment mark arrangement region 8 in a shot and the second alignment mark arrangement region 9 in an adjacent shot share one scribe line region and so that the left end scribe line region 4 and the right end scribe line region 5 are overlaid on each other. This makes it possible to separate the first alignment mark arrangement region 8 and the second alignment mark arrangement region 9 along the scribe line region, which is convenient in analysis or the like later.

Figure 6:
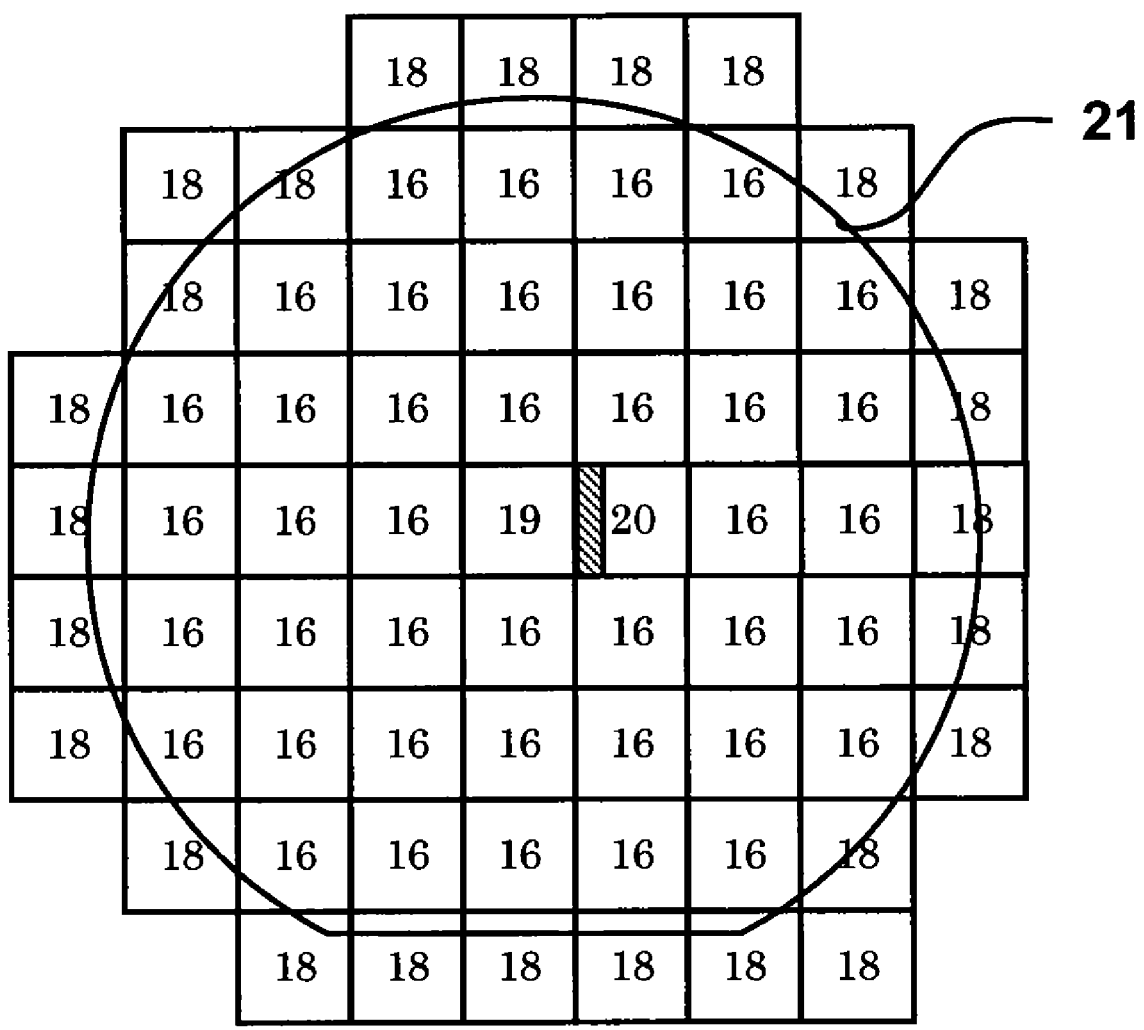
FIG. 6 illustrates a wafer which is patterned using the reticle.

When the reticle illustrated in FIG. 3 is used, the layout as illustrated in FIG. 2 may be realized, but a layout as illustrated in FIG. 6 may also be realized.

In FIG. 6, the shots A (16), the shots C (18), a shot D (19), and a shot E (20) are illustrated on the wafer 21. In a shot A (16), the multi-chip region 2, the first alignment mark arrangement region 8, the second alignment mark arrangement region 9, and the scribe line region 3 are arranged. In the shot D (19), in addition to the multi-chip region 2, the first alignment mark arrangement region 8, the second alignment mark arrangement region 9, and the scribe line region 3, the TEG pattern region 11 is also arranged. A diagonally shaded portion of FIG. 6 indicates the TEG pattern region included in the shot D (19). An end on the right of the shot E (20) is aligned with ends on the right of shots A (16) above and below the shot E (20). In this way, even if there is the TEG pattern region, a simple layout with no displacement of the lattice formed by the shots can be realized.

Figure 4:
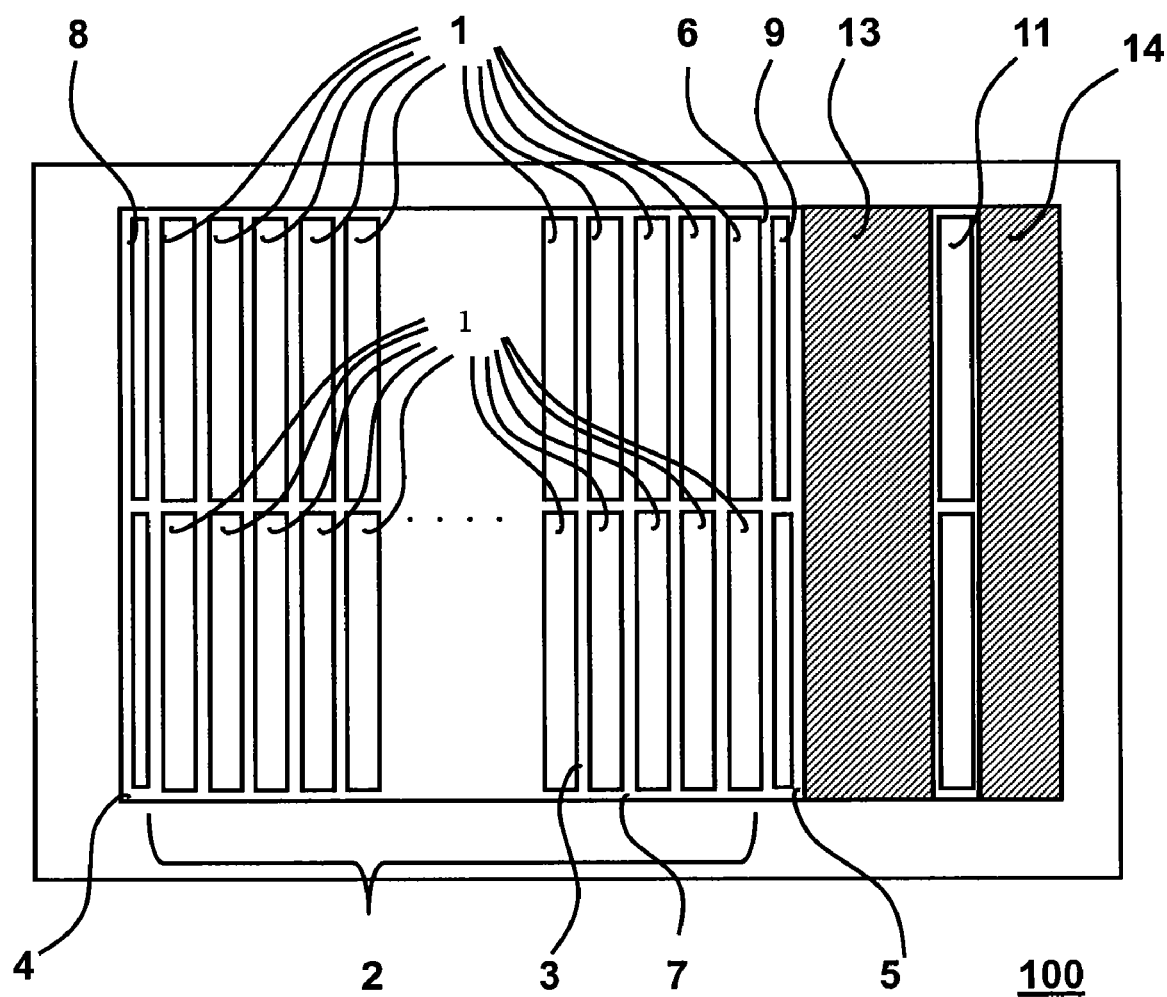
FIG. 4 is a plan view of a reticle for a projection exposure apparatus according to a third embodiment of the present invention.

FIG. 4 is a plan view of a reticle for a projection exposure apparatus according to a third embodiment of the present invention.

The reticle illustrated in FIG. 4 is different from that illustrated in FIG. 1 in that two chip regions are arranged in the first direction. The first alignment mark arrangement region 8 is vertically divided into two, the second alignment mark arrangement region 9 is vertically divided into two, and, similarly, the TEG pattern region 11 is vertically divided into two. The scribe line region 3 is formed also between the regions vertically divided into two. This eliminates a silicon oxide film, a silicon nitride film, a metal film, or the like which is an obstacle to separating the chips from one another in portions along which the chips are separated from one another, and thus, smooth chip separation is made possible. More specifically, cracks in the chips and peeling off of a film when the chips are separated from one another can be prevented, the number of chips per wafer can be increased, and further, highly accurate alignment can be performed. In FIG. 4, a case in which the chips are arranged in 2×N has been described, but even in a case of small chips the length of sides of which in the first direction is still smaller and which are arranged on the reticle substrate in M×N in lattice, similarly to the case illustrated in FIG. 4, the alignment mark arrangement region and the TEG pattern region may be divided according to the division of the chip region.

Figure 5:
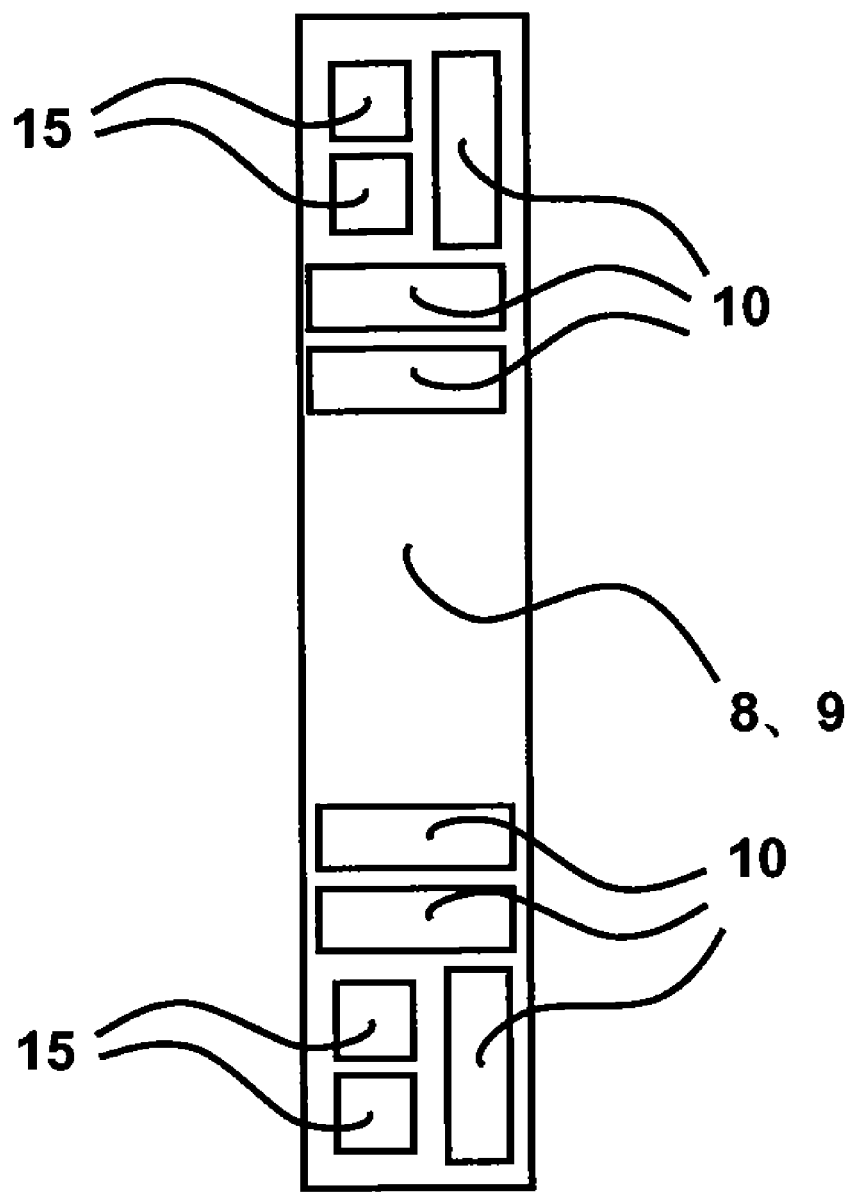
FIG. 5 is a detail view of an alignment mark arrangement region according to the present invention.

FIG. 5 is a detail view of the alignment mark arrangement regions 8 and 9. In addition to the alignment marks 10 for detecting misalignment in the X direction and in the Y direction, a pattern 15 for overlay measurement such as a vernier may also be included in the alignment mark arrangement region, and if there is enough room, another mark and the like may be arranged therein.

What is claimed is:

1. A reticle for a projection exposure apparatus, comprising:
    a reticle substrate;
    rectangular chip regions disposed on a surface of the reticle substrate and each surrounded by sides in a first direction and sides in a second direction orthogonal to the first direction;
    a rectangular first alignment mark arrangement region disposed on the surface and surrounded by sides in the first direction and sides in the second direction;
    a rectangular second alignment mark arrangement region disposed on the surface and surrounded by sides in the first direction and sides in the second direction;
    a scribe line region provided around the rectangular chip regions; and
    scribe line regions provided so as to be adjacent to the sides in the second direction of the rectangular first alignment mark arrangement region and to the sides in the second direction of the rectangular second alignment mark arrangement region, respectively, wherein:
    the rectangular first alignment mark arrangement region is adjacent via the scribe line region to one end portion in the second direction of a multi-chip region including a plurality of the rectangular chip regions;
    the rectangular second alignment mark arrangement region is adjacent via the scribe line region to another end portion in the second direction of the multi-chip region;
    the rectangular first alignment mark arrangement region and the rectangular second alignment mark arrangement region each comprise at least an alignment mark arranged therein; and
    a sum of a length of each of the sides in the second direction of the rectangular first alignment mark arrangement region and a length of each of the sides in the second direction of the rectangular second alignment mark arrangement region is equal to or smaller than a length of each of the sides in the second direction of each of the rectangular chip regions.

2. A reticle for a projection exposure apparatus according to claim 1, wherein the multi-chip region comprises the chip regions in a plurality of rows and columns arranged in lattice.

3. A reticle for a projection exposure apparatus according to claim 1, wherein the scribe line region comprises no alignment mark and no test element group pattern arranged therein.

4. A reticle for a projection exposure apparatus according to claim 1, wherein the rectangular first alignment mark arrangement region and the rectangular second alignment mark arrangement region each comprise, in addition to the alignment mark, a pattern for overlay measurement formed therein.

5. A reticle for a projection exposure apparatus according to claim 1, wherein the scribe line region has a width in a range of 1 to 40 μm.

6. A reticle for a projection exposure apparatus according to claim 1, further comprising on the same reticle substrate a test element group pattern region having a length in the second direction equal to the length of each of the sides in the second direction of each of the rectangular chip regions.

7. A reticle for a projection exposure apparatus, comprising:
a reticle substrate;
rectangular chip regions disposed on a surface of the reticle substrate and each surrounded by sides in a first direction and sides in a second direction orthogonal to the first direction;
a rectangular first alignment mark arrangement region disposed on the surface and surrounded by sides in the first direction and sides in the second direction;
a rectangular second alignment mark arrangement region disposed on the surface and surrounded by sides in the first direction and sides in the second direction; and
a scribe line region provided around the rectangular chip regions, the rectangular first alignment mark arrangement region, and the rectangular second alignment mark arrangement region, wherein:
the rectangular first alignment mark arrangement region is adjacent via the scribe line region to one end portion in the second direction of a multi-chip region including a plurality of the rectangular chip regions;
the rectangular second alignment mark arrangement region is adjacent via the scribe line region to another end portion in the second direction of the multi-chip region;
the rectangular first alignment mark arrangement region and the rectangular second alignment mark arrangement region each comprise at least an alignment mark arranged therein; and
a sum of a length of each of the sides in the second direction of the rectangular first alignment mark arrangement region, a length of each of the sides in the second direction of the rectangular second alignment mark arrangement region, and a length in the second direction of the scribe line region is equal to or smaller than a length of each of the sides in the rectangular second direction of each of the rectangular chip regions.

8. A reticle for a projection exposure apparatus according to claim 7, wherein the multi-chip region comprises the chip regions in a plurality of rows and columns arranged in lattice.

9. A reticle for a projection exposure apparatus according to claim 7, wherein the scribe line region comprises no alignment mark and no test element group pattern arranged therein.

10. A reticle for a projection exposure apparatus according to claim 7, wherein the rectangular first alignment mark arrangement region and the rectangular second alignment mark arrangement region each comprise, in addition to the alignment mark, a pattern for overlay measurement formed therein.

11. A reticle for a projection exposure apparatus according to claim 7, wherein the scribe line region has a width in a range of 1 to 40 μm.

12. A reticle for a projection exposure apparatus according to claim 7, further comprising on the same reticle substrate a test element group pattern region having a length in the second direction equal to the length of each of the sides in the second direction of each of the rectangular chip regions.

13. A reticle for a projection exposure apparatus, comprising:
a reticle substrate;
a multi-chip region formed by repeatedly arranging on the reticle substrate a rectangular chip region having sides in a first direction and sides in a second direction and scribe line regions respectively arranged around the four sides of the rectangular chip region;
a rectangular first alignment mark arrangement region which is arranged outside one end portion of the multi-chip region via one of the scribe line regions, and has sides in the first direction and sides in the second direction; and
a rectangular second alignment mark arrangement region which is arranged outside another end portion of the multi-chip region via another one of the scribe line regions, and has sides in the first direction and sides in the second direction, wherein:
the rectangular first alignment mark arrangement region and the rectangular second alignment mark arrangement region each comprise at least an alignment mark arranged therein; and
a sum of a length of each of the sides in the second direction of the rectangular first alignment mark arrangement region and a length of each of the sides in the second direction of the rectangular second alignment mark arrangement region is equal to or smaller than a length of each of the sides in the second direction of the rectangular chip region.

14. A reticle for a projection exposure apparatus, comprising:
a reticle substrate;
a multi-chip region formed by repeatedly arranging on the reticle substrate a rectangular chip region having sides in a first direction and sides in a second direction and scribe line regions respectively arranged around the four sides of the rectangular chip region;
a rectangular first alignment mark arrangement region which is arranged outside one end portion of the multi-chip region via one of the scribe line regions, and has sides in the first direction and sides in the second direction;
a second scribe line region arranged outside the rectangular first alignment mark arrangement region;
a rectangular second alignment mark arrangement region which is arranged outside another end portion of the multi-chip region via another one of the scribe line regions, and has sides in the first direction and sides in the second direction; and
a third scribe line region arranged outside the rectangular second alignment mark arrangement region, which has a length in the second direction equal to a length of the second scribe line region in the second direction, wherein:

the rectangular first alignment mark arrangement region and the rectangular second alignment mark arrangement region each comprise at least an alignment mark arranged therein; and a sum of a length of each of the sides in the second direction of the rectangular first alignment mark arrangement region, a length of each of the sides in the second direction of the rectangular second alignment mark arrangement region, and a length in the second direction of one of the second scribe line region and the third scribe line region is equal to or smaller than a length of each of the sides in the second direction of the rectangular chip region.

15. An exposure method using the reticle for a projection exposure apparatus according to claim 1, the method, comprising:

patterning the rectangular chip region, the rectangular first alignment mark arrangement region, and the rectangular second alignment mark arrangement region, simultaneously on a wafer.

16. An exposure method using the reticle for a projection exposure apparatus according to claim 2, the method, comprising:

patterning the rectangular chip region, the rectangular first alignment mark arrangement region, and the rectangular second alignment mark arrangement region, simultaneously on a wafer.

* * * * *